(12) United States Patent
van Kervinck et al.

(10) Patent No.: US 10,079,206 B2
(45) Date of Patent: Sep. 18, 2018

(54) FABRICATING UNIQUE CHIPS USING A CHARGED PARTICLE MULTI-BEAMLET LITHOGRAPHY SYSTEM

(71) Applicant: MAPPER Lithography IP B.V., Delft (NL)

(72) Inventors: Marcel Nicolaas Jacobus van Kervinck, The Hague (NL); Vincent Sylvester Kuiper, The Hague (NL); Marco Jan-Jaco Wieland, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 15/389,581

(22) Filed: Dec. 23, 2016

(65) Prior Publication Data

US 2018/0122737 A1 May 3, 2018

Related U.S. Application Data (60) Provisional application No. 62/413,470, filed on Oct. 27, 2016.

(51) Int. Cl.
*H01L 21/44* (2006.01)
*H01L 23/528* (2006.01)
(Continued)

(52) U.S. Cl.
CPC .......... *H01L 23/528* (2013.01); *G03F 7/2059* (2013.01); *G06F 17/5077* (2013.01)

(58) Field of Classification Search
CPC .... G03F 7/70441; G03F 1/38; G06F 17/5081; G06F 2217/12; G06F 17/5068
(Continued)

(56) References Cited

U.S. PATENT DOCUMENTS 4,875,971 A 10/1989 Orbach et al.
4,879,605 A 11/1989 Warkentin et al.
(Continued)

FOREIGN PATENT DOCUMENTS

CN 101271825 A 9/2008
EP 1598854 A1 11/2005
(Continued)

OTHER PUBLICATIONS

Ed Korczynski, "Multibeam Patents Direct Deposition & Direct Etch", https://semimd.com/blog/2016/11/14, Nov. 14, 2016.
(Continued)

*Primary Examiner* — Luan C Thai
(74) *Attorney, Agent, or Firm* — Hoyng Rokh Monegier LLP; David P. Owen (57) ABSTRACT

Method of manufacturing electronic devices using a maskless lithographic exposure system using a maskless pattern writer, wherein beamlet control data is generated for controlling the maskless pattern writer to expose a wafer for creation of the electronic devices. The beamlet control data is generated based on design layout data defining a plurality of structures, such as vias, for the electronic devices to be manufactured from the wafer, and selection data defining which of the structures of the design layout data are applicable for each electronic device to be manufactured from the wafer, the selection data defining a different set of the structures for different subsets of the electronic devices. Exposure of the wafer according to the beamlet control data results in exposing a pattern having a different set of the structures for different subsets of the electronic devices.

21 Claims, 7 Drawing Sheets

(51) Int. Cl.
*G06F 17/50* (2006.01)
*G03F 7/20* (2006.01)

(58) Field of Classification Search
USPC ........................................................ 438/666
See application file for complete search history.

(56) References Cited

U.S. PATENT DOCUMENTS

| | | | |
|---|---|---|---|
| 4,974,736 | A | 12/1990 | Okunuki et al. |
| 5,093,550 | A | 3/1992 | Gerber et al. |
| 5,410,124 | A | 4/1995 | Jackson |
| 5,733,711 | A | 3/1998 | Juengling |
| 6,063,685 | A | 5/2000 | Steffan et al. |
| 7,075,093 | B2 | 7/2006 | Gorski et al. |
| 7,107,560 | B1 | 9/2006 | New |
| 7,316,934 | B2 | 1/2008 | Mangell |
| 7,391,499 | B2 | 6/2008 | Schmidt |
| 7,407,252 | B2 | 8/2008 | Chabreck et al. |
| 7,590,966 | B2 | 9/2009 | Sandstrom et al. |
| 7,721,090 | B1 | 5/2010 | Deepak et al. |
| 7,818,569 | B2 | 10/2010 | Devadas et al. |
| 7,840,803 | B2 | 11/2010 | Clarke et al. |
| 7,842,525 | B2 | 11/2010 | Sandstrom |
| 8,259,285 | B2 * | 9/2012 | Troost ................. G03F 7/70283 355/53 |
| 8,492,072 | B2 | 7/2013 | Sandtner |
| 8,539,395 | B2 | 9/2013 | Ivansen et al. |
| 8,754,538 | B2 | 6/2014 | Ortner |
| 8,767,185 | B2 | 7/2014 | Sandström |
| 8,872,833 | B2 | 10/2014 | van Dyke et al. |
| 8,884,255 | B2 * | 11/2014 | Derks ................... B82Y 10/00 250/492.1 |
| 8,893,059 | B2 | 11/2014 | Carroll |
| 8,896,809 | B2 | 11/2014 | Dominicus et al. |
| 8,972,229 | B2 | 3/2015 | Deng et al. |
| 9,140,978 | B2 | 9/2015 | Ken |
| 9,171,806 | B2 | 10/2015 | Ortner |
| 9,224,694 | B2 | 12/2015 | Pagani |
| 9,465,906 | B2 * | 10/2016 | Chang ................. G06F 17/5081 |
| 9,846,368 | B2 | 12/2017 | Tinnemans et al. |
| 2001/0028991 | A1 | 10/2001 | Inanami et al. |
| 2001/0046730 | A1 | 11/2001 | Suzuki et al. |
| 2002/0010905 | A1 | 1/2002 | Inanami et al. |
| 2003/0064531 | A1 | 4/2003 | Mautz et al. |
| 2003/0144760 | A1 | 7/2003 | Mangell |
| 2004/0019791 | A1 | 1/2004 | Whyte |
| 2005/0047543 | A1 | 3/2005 | Sandstrom |
| 2005/0177268 | A1 | 8/2005 | Morinaga et al. |
| 2006/0064191 | A1 | 3/2006 | Naya et al. |
| 2006/0209313 | A1 | 9/2006 | van den Akker et al. |
| 2006/0221320 | A1 | 10/2006 | Bleeker et al. |
| 2007/0116276 | A1 | 5/2007 | Tsurumoto |
| 2007/0134560 | A1 | 6/2007 | Dirksen et al. |
| 2007/0195834 | A1 | 8/2007 | Tanaka et al. |
| 2007/0242252 | A1 | 10/2007 | Tinnemans |
| 2008/0027576 | A1 | 1/2008 | Kyoh |
| 2008/0119956 | A1 | 5/2008 | Mangell |
| 2008/0121709 | A1 | 5/2008 | Hayashi et al. |
| 2009/0011345 | A1 | 1/2009 | Tinnemans et al. |
| 2009/0100392 | A1 | 4/2009 | Ivaldi |
| 2009/0315193 | A1 | 12/2009 | Ortner |
| 2010/0279231 | A1 | 11/2010 | Sandtner |
| 2012/0271444 | A1 | 10/2012 | Matsumoto |
| 2013/0127442 | A1 | 5/2013 | Satoh et al. |
| 2014/0170566 | A1 | 6/2014 | Ivansen et al. |
| 2015/0012439 | A1 | 1/2015 | Sakurai et al. |
| 2015/0026650 | A1 | 1/2015 | Munson |
| 2016/0126062 | A1 | 5/2016 | Muraki et al. |
| 2016/0148664 | A1 | 5/2016 | Katoh et al. |
| 2016/0254227 | A1 | 9/2016 | Leobandung |
| 2017/0269483 | A1 | 9/2017 | Tinnemans et al. |

FOREIGN PATENT DOCUMENTS

| | | |
|---|---|---|
| JP | S 58116732 | 7/1983 |
| JP | 05 343278 | 12/1993 |
| JP | 09 007924 | 1/1997 |
| JP | 1998090874 A | 4/1998 |
| JP | 2001 109128 | 4/2001 |
| JP | 2002 055431 A | 2/2002 |
| JP | 2002305141 A | 10/2002 |
| JP | 2005-57203 | 3/2005 |
| JP | 2005159198 A | 7/2005 |
| JP | 2005-244132 | 9/2005 |
| JP | 2006 139165 A | 6/2006 |
| JP | 2007514987 A | 6/2007 |
| JP | 2007 260295 | 10/2007 |
| JP | 2008 047857 A | 2/2008 |
| JP | 2010-93663 | 4/2010 |
| JP | 2011 108830 | 6/2011 |
| JP | 2012-12712 A | 1/2012 |
| JP | 2014515885 A | 7/2014 |
| JP | 2016086103 A | 5/2016 |
| WO | WO 1999 042945 A1 | 8/1999 |
| WO | WO 2001 039269 A1 | 5/2001 |
| WO | WO 2002 084719 | 10/2002 |
| WO | WO 2003 090259 A2 | 10/2003 |
| WO | WO 2004 105125 | 12/2004 |
| WO | WO 2008 043934 | 4/2008 |
| WO | WO 2010 134026 | 11/2010 |
| WO | WO 2010 134026 A1 | 11/2010 |
| WO | WO 2011 003201 A1 | 1/2011 |
| WO | WO 2011 051301 | 5/2011 |
| WO | WO 2011 107601 A1 | 9/2011 |
| WO | WO 2011 107603 | 9/2011 |
| WO | WO 2011 117253 | 9/2011 |
| WO | WO 2012 062726 | 5/2012 |
| WO | WO 2012 062727 A1 | 5/2012 |
| WO | WO 2012 143548 | 10/2012 |
| WO | WO 2012 143555 A2 | 10/2012 |
| WO | WO 2015 008021 A1 | 1/2015 |
| WO | WO 2015 150398 | 10/2015 |
| WO | WO 2016 156378 A1 | 10/2016 |

OTHER PUBLICATIONS

Mark Lapedus, "New Patterning Paradigm?", https://semiengineering.com, Apr. 16, 2015.
"Application-specific IC" Nov. 25, 2016 (Nov. 25, 2016), XP055403899, Internet: https://en.wikipedia.org/w/index.php?title=Application-specific_integrated_circuit&oldid=751376110.
Anonymous, "Gate array—Wikipedia", Jul. 6, 2016, XP055403902, Internet:URL: https://en.wikipedia.org/w/index.php? title=Gate_array&oldid= 728662966.
Parker et al: "A high throughput electron-beam direct-write lithography system", Microlithography World, US, Edit 9, nr. 3, Jan. 1, 2000 (Jan. 1, 2000), bladzijden 22. 24-25.

* cited by examiner

FABRICATING UNIQUE CHIPS USING A CHARGED PARTICLE MULTI-BEAMLET LITHOGRAPHY SYSTEM

TECHNICAL FIELD

The invention relates to a method of manufacturing, i.e. fabricating electronic devices such as semiconductor chips. More specifically, the invention relates to the fabrication of unique chips using a charged particle multi-beamlet lithography machine, wherein the uniqueness of the chips is defined by structures such as via structures on the chips. Consequently the invention equally relates to unique chips produced using this new method of manufacture, as well as to so called "fabs", i.e. manufacturing facilities applying this novel method, and to maskless lithographic exposure system adapted for executing the improved method of manufacture.

BACKGROUND ART

In the semiconductor industry, lithography systems are used to create, i.e. fabricate such electronic devices, typically in the form of integrated circuits formed on silicon wafer, commonly referred to as semiconductor chips. Photolithography utilizes reusable optical masks to project an image of a pattern representing the desired circuit structures onto a silicon wafer as part of the manufacturing process. The mask is used repeatedly to image the same circuit structures on different parts of a silicon wafer and on subsequent wafers, resulting in a series of identical chips being fabricated with each wafer, each chip having an identical circuit design.

In contemporary days, various technologies relating to data security, traceability, and anti-counterfeiting create an increasing need for unique chips having unique circuits or codes, or other unique hardware features for diversification of the chips. Such unique chips are known and often implement a security related operation in an obfuscated manner requiring the chip to be truly unique. The known unique chips are typically realized after the manufacture of a chip, e.g. by manufacturing a series of identical chips using mask based lithography and then, after manufacture, disrupting certain connections in the chip or by assessing the uniqueness of the chip afterwards upon inspection and control of certain features. The masks used in this process are expensive to produce, and manufacturing a unique mask for each single chip is clearly much too expensive, for which reason mask based photolithography is considered unsuitable for fabricating unique chips.

Hence it has been suggested to utilize maskless lithography for the purpose of creating unique chips. With maskless lithography no mask is used, and instead the required pattern representing the circuit design is input to the maskless lithography system in the form of a data file such as a GDSII or OASIS file containing the circuit design layout to be transferred to the target, e.g. wafer, to be exposed by the maskless lithography system.

A maskless lithography and data input system is disclosed in WO 2010/134026 in the name of Applicant of the present invention. WO 2010/134026 is hereby incorporated by reference in its entirety. The disclosed maskless system writes patterns onto wafers directly using charged particle beamlets such as electron beamlets. Because the desired pattern for exposing each chip is represented as data instead of a mask, it becomes possible to utilize such system for the manufacture of unique chips. The pattern data that is input to the exposure system, representing the unique electronic devices or chips to be created, may be made unique by using a different GDSII input file for each unique electronic device to be created.

WO 2011/117253 and WO 2011/051301, both assigned to the Applicant of the present invention and hereby incorporated by reference in their entirety, disclose various examples of electronic devices or chips that can be created using a charged particle lithography system.

A straight forward method of creating secure, at least unique devices, i.e. using the known maskless exposure system, may however not be optimized, at least adapted for securely producing unique electronic devices. Disadvantageously, the processing of GDSII or OASIS files associated herewith is typically performed outside of the operations of the operator of the lithography system. Moreover, the processed GDSII/OASIS files may be used and stored over a longer period of time. It is deemed desirable according insight underlying and in fact part of the present invention to minimize exposure and exposure time of the unique via design data used in the creation of the unique electronic devices or chips for security reasons, as the uniqueness of the electronic device or chip will typically be used for data security, traceability and anti-counterfeiting applications.

SUMMARY OF THE INVENTION

The present invention provides a solution for manufacture of unique electronic circuits by implementing different structures in different chips, wherein public exposure of specific structures to be used in the creation of the chips can be minimized. Non limiting examples of such structures are connections between metal layers, also known as vias, connections between a metal layer and a gate e.g. in a contact layer, connections in a local interconnect layer, and P or N implants of certain parts of a transistor or diode. One way of making chips unique is by implementing different structures in different chips. For example the number of vias and the location of the vias may be different for each chip. The different path ways thus created by the vias result in the same data input being presented to the chips producing different data outputs for each chip. Hereto, for a specific part in the layout of an electronic device, selection data can be provided to define which of the vias are to be enabled in a chip, resulting in an individualized area in the chip.

All possible structures from which a selection is to be made for individualizing a chip or a batch of chips can be part of the generic design layout data, e.g. a GDSII or OASIS file. The locations of the selectable structures can be provided as location meta data. The specific part can be individualized by enabling different sets of structures for different subsets of the electronic devices based on the location meta data and the selection data. The selection of the structures can be made at a late processing stage close to or within the maskless lithographic exposure system, thereby minimizing public exposure of the specific structures used to individualize the electronic device.

According to an aspect of the invention a method of manufacturing electronic devices using a maskless lithographic exposure system is proposed. The maskless lithographic exposure system can use a maskless pattern writer. The method can comprise generating beamlet control data for controlling the maskless pattern writer to expose a wafer for creation of the electronic devices. The beamlet control data can be generated based on design layout data defining a plurality of structures for the electronic devices to be manufactured from the wafer. The beamlet control data can be generated further based on selection data defining which of the structures of the design layout data are applicable for each electronic device to be manufactured from the wafer, the selection data defining a different set of the structures for different subsets of the electronic devices. Exposure of the wafer according to the beamlet control data can result in exposing a pattern having a different set of the structures for different subsets of the electronic devices.

The maskless pattern writer may be a raster scanning based maskless pattern writer, in which case the beamlet control data may take the form of pattern bitmap data. The maskless pattern writer may be a vector scanning based maskless pattern writer, in which case the beamlet control data may be formatted in a manner suitable for vector scanning.

The electronic devices can be individualized or made unique by enabling different sets of the structures, e.g. by creating different vias, in each of the electronic devices.

Advantageously the method enables the creation of the individualized area of the electronic devices to remain within the operations of the maskless lithographic exposure system and public exposure time of the design data of the individualized area is minimized. An advantageous side effect is that the required processing power and memory may remain low, in that the design layout data can be reused for the creation of multiple chips, where utilizing the known method of creating unique chips requires design layout data for each unique chip and thus capacity and processing time for each unique chip design manufactured.

In an embodiment the design layout data can comprise common design layout data defining structures applicable for all of the electronic devices and non-common design layout data defining structures applicable for certain ones of the electronic devices from which the different set of the structures is selectable according to the selection data. Thus, structures can be located in the common part and in the individualized area of an electronic device.

In an embodiment the selection data can specify for each of the electronic devices whether one or more of the structures defined in the design layout data is to be included or not included in the beamlet control data.

The selection data may use a single bit to specify individual ones of the structures defined in the design layout data to be included or not included in the beamlet control data. Advantageously this minimized the size of the selection data.

The beamlet control data may include bitmap data representing a selected subset of the structures defined in the design layout data and may not include bitmap data representing non-selected ones of the structures defined in the design layout data.

The selected subset of the structures may comprise structures indicated for selection in the selection data, and the non-selected ones of the structures may comprise structures not indicated for selection in the selection data.

The beamlet control data may be generated once per field.

In an embodiment the design layout data can only include design layout data defining the structures selectable according to the selection data. In this case optical lithography may be applied in conjunction with maskless lithography, wherein the common parts of the electronic devices are created using photolithography. The individualized area of an electronic device is then created as described above.

In an embodiment the method can comprise receiving the design layout data in the maskless lithographic exposure system via a first network path and receiving the selection data in the maskless lithographic exposure system via a second network path separate from the first network path. This enables provisioning of the design layout data and the selection data from a different sources. Typically the selection data will be received from a source external to the maskless lithographic exposure system, such as from a black box device within a manufacturing part of the fab.

As the design layout data, for example in the form of a GDSII or OASIS data file, typically concerns large amounts of data while the selection data may take the form of a relatively small file, the first network path may have a higher data transmission bandwidth than the second network path. The first network path is for example based on fiber optics network connections. The second network path is for example based on cat6 Ethernet network connections.

In an embodiment the step of generating the beamlet control data can additionally be based on location meta data. The location meta data can specify locations of the structures defined in the design layout data. The location meta data thus identifies the locations of the structures in the design layout, while the selection data identifies which structures are to be included in the beamlet control data for the creation of the electronic device. Advantageously, the size of the selection data and the location meta data is typically small compared to the design layout data, enabling provisioning of the location meta data and the selection data to the maskless lithographic exposure system using relatively low bandwidth and low cost network connections, e.g. based on cat6 Ethernet.

In an embodiment one or more of the structures defined in the design layout data can be selected to be included in the beamlet control data on the basis of both the location meta data and the selection data.

The design layout data may comprise the location meta data. Thus, the location meta data may be received in the maskless lithographic exposure system together with the design layout data. The location meta data may be embedded with the design layout data or received as a separate file.

Alternatively, the location meta data may be received separate from the design layout data. Thus the location meta data may be received via different network routes and/or addressed to different subsystems of the maskless lithographic exposure system. The location meta data may be received together with the selection data.

The selection data may be received in an encrypted form to provide additional data security within the fab in the process of creating unique electronic devices.

The beamlet control data may be encrypted to provide additional data security within the fab in the process of creating unique electronic devices.

In an embodiment the method can further comprise generating wipe out mask data based on the location meta data and the selection data. The generating of the beamlet control data can comprise merging the wipe out mask data with the design layout data or a derivative of the design layout data to delete non selected structures from the design layout data.

In an embodiment the electronic devices can be semiconductor chips and the maskless pattern writer can be a charged particle multi-beamlet lithography machine or e-beam machine.

According to an aspect of the invention an electronic device such as semiconductor chip is proposed, which is created using one or more of the above described methods.

In an embodiment the electronic device can be a truly unique semiconductor chip different, e.g. functionally different, from any other semiconductor chip using the method of the invention.

In an embodiment the electronic device can comprise a metal layer and an adjacent layer wherein vias are located at locations specific to the electronic device.

According to an aspect of the invention a maskless lithographic exposure system is proposed configured to perform one or more of the above described methods.

In an embodiment the maskless lithography exposure system can comprise a black box device that is configured to generate the selection data defining which of the structures of the design layout data are applicable for each electronic device to be manufactured from the wafer, the selection data defining a different set of the structures for different subsets of the electronic devices.

The black box may be owned by a third party, e.g. an IP block owner or the owner of the manufactured chip, or a key management infrastructure owner. Advantageously the black box can be located within the fab close to the operations of the lithography machine, thereby minimizing public exposure of the selection data. This in contrast to known chip manufacturing solutions, where a black box for individualizing chips is typically located outside of the fab and used to individualize the chips after being created.

According to an aspect of the invention a semiconductor fabrication plant is proposed comprising a maskless lithography exposure system as described above.

According to an aspect of the invention a lithography subsystem is proposed comprising a rasterizer and using a maskless pattern writer such as a charged particle multi-beamlet lithography machine or e-beam machine. The rasterizer can be configured to generate beamlet control data for controlling the maskless pattern writer to expose a wafer for the creation of electronic devices. The beamlet control data can be generated based on design layout data defining a plurality of via structures for the electronic devices to be manufactured from the wafer. The beamlet control data can be generated further based on selection data defining which of the structures of the design layout data are applicable for each electronic device to be manufactured from the wafer, the selection data defining a different set of the structures for different subsets of the electronic devices. Exposure of the wafer according to the beamlet control data can result in exposing a pattern having a different subset of the via structures for different subsets of the electronic devices.

In an embodiment the rasterizer can be configured to receive pattern vector data in a lithography subsystem specific format, e.g. based on an OASIS file format, generated from the design layout data. The rasterizer can further be configured to receive the selection data. The rasterizer can further be configured to receive location meta data specifying a location of each of the structures defined in the design layout data and selectable according to the selection data. The rasterizer can further be configured to process the pattern vector data, the common via meta data and the unique via meta data to obtain the beamlet control data.

According to an aspect of the invention an electronic device is proposed that can be created using the lithography subsystem described above.

In an embodiment the electronic device can be a truly unique semiconductor chip different from any other created semiconductor chip.

According to an aspect of the invention an electronic device is proposed that can comprise a semiconductor chip. The semiconductor chip can comprise a plurality of structures formed in three or more layers of the semiconductor chip. The semiconductor chip can be a member of a set of semiconductor chips, each of the semiconductor chips of the set having a set of common structures which are present in all of the semiconductor chips of the set and a set of non-common structures which are only present in a subset of the semiconductor chips of the set. The non-common structures can be formed on at least a first one of the layers having a second one of the layers above the first layer and having a third one of the layers below the first layer.

According to an aspect of the invention an electronic device is proposed that can comprise a semiconductor chip. The semiconductor chip can comprise a plurality of structures formed in a plurality of layers of the semiconductor chip. The semiconductor chip can be a member of a set of semiconductor chips, each of the semiconductor chips of the set having a set of common structures which are present in all of the semiconductor chips of the set and a set of non-common structures which are only present in a subset of the semiconductor chips of the set. The non-common structures can include at least one of: connections between metal layers of the plurality of layers; connections between a metal layer and a gate in a contact layer of the plurality of layers; connections in a local interconnect layer of the plurality of layers; and a P- or N-doped diffusion region of a transistor or diode of one of the plurality of layers.

In an embodiment the common structures and the non-common structures of the semiconductor chip can be interconnected to form an electronic circuit.

In an embodiment the electronic device can comprise at least one input terminal for receiving a challenge and at least one output terminal for outputting a response. The electronic circuit can form a challenge-response circuit connected to the at least one input terminal and the at least one output terminal. The challenge-response circuit can be adapted for generating a response at the at least one output terminal based on a challenge applied to the at least one input terminal, the challenge and the response having a predetermined relationship.

Various aspects and embodiments of the invention are further defined in the following description and claims.

Hereinafter, embodiments of the invention will be described in further detail. It should be appreciated, however, that these embodiments may not be construed as limiting the scope of protection for the present invention.

BRIEF DESCRIPTION OF THE DRAWINGS

Embodiments will now be described, by way of example only, with reference to the accompanying schematic drawings in which corresponding reference symbols indicate corresponding parts, and in which.

The figures are meant for illustrative purposes only, and do not serve as restriction of the scope or the protection as laid down by the claims.

DESCRIPTION OF EMBODIMENTS

In the following examples reference is made to semiconductor chips, but it is to be understood that the invention is not limited to chips and applies more generally to the creation of electronic devices having individualized, e.g. unique features. The electronic device may be a read only memory (ROM). For example, batches of chips with individualized ROM load may be created using the invention. Such batches are typically small batches, e.g. created from one or less than one wafer.

The process performed by charged particle multi-beamlet lithography is also being referred to as an electron beam or e-beam exposure. The electron beam exposure method is a maskless exposure method. The electron beams used for writing a target such as a wafer during electron beam exposure are also being referred to as beamlets.

Unique chips are designed to be unique with respect to other chips. This does not exclude the possibility that more than one unique chip can be made using the invention, for example to create a spare unique chip for use in case the original unique chip is damaged, to created batches of the same chip or for any other reason. A unique semiconductor chip that is functionally different from any other semiconductor chip may be referred to as a truly unique chip. The creation of a visually readable unique ID on a chip may also be regarded as creating a unique chip. Copies of the unique chip may be made by repeating the creation of the chip on different wafers or a single wafer may include one or more copies of the unique chip.

Figure 1:
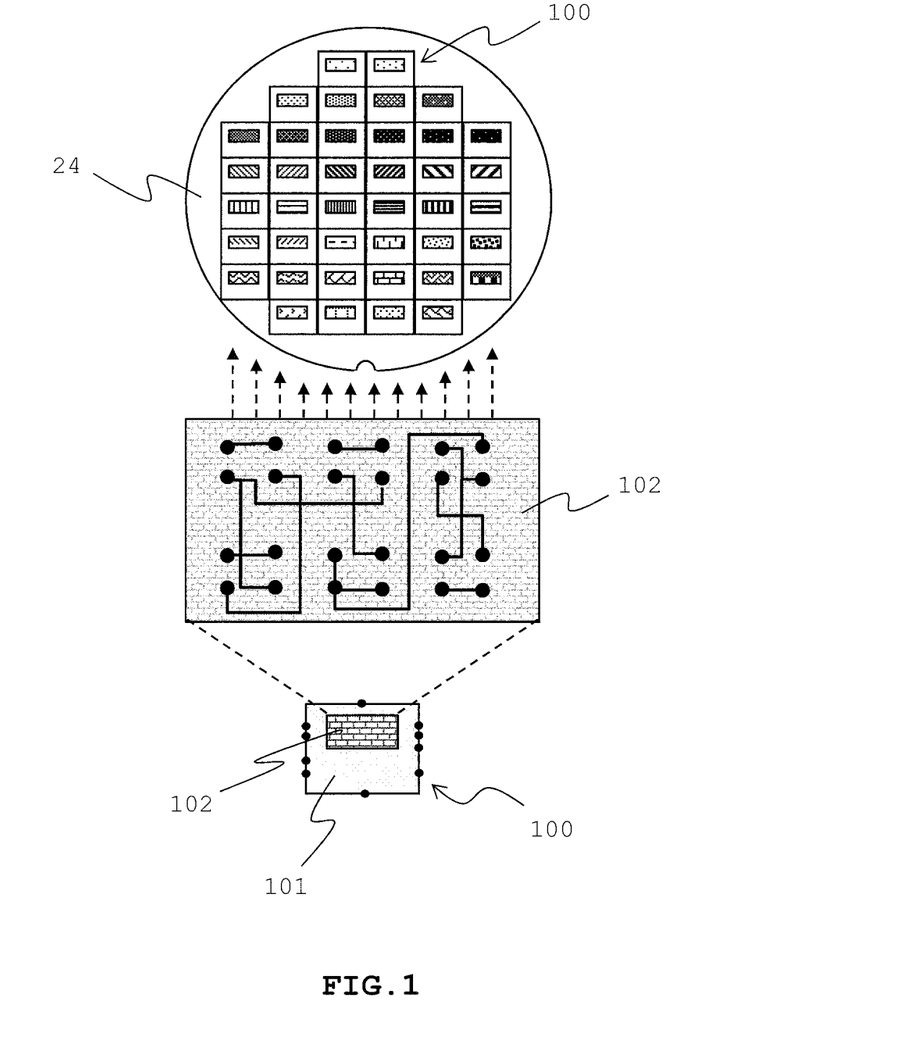
FIG. 1 shows a simplified unique chip and a wafer with multiple unique chips of an exemplary embodiment of the invention.

FIG. 1 shows an exemplary simplified unique chip 100 containing a common part 101 and an individualized area 102. The common part 101 may be replicated in other chips created on the wafer 24 resulting in multiple chips having the same identical part. The individualized area 102 may be different from other chips created on the wafer 24. This is illustrated in the top of FIG. 1 where a wafer 24 is shown containing a unique chip 100 and 39 other unique chips, each unique chip having a different individualized area. The combined common part 101 and individualized area 102 may result in unique chip 100.

The individualized area 102 may be realized by selecting and writing specific structures, such as vias as illustrated in the middle part of FIG. 1 by the black dots. Other unique chips may have different structures such as vias resulting in the realization of different interconnections within a layer or between layers of the electronic circuit.

Alternatively or additionally to specific vias, other connections between metal layers, connections between a metal layer and a gate e.g. in a contact layer, connections in a local interconnect layer, and/or the presence or absence or structure of diffusion regions (e.g. P- or N-doped regions) of a transistor or diode may be selected and written to realize the individualized area 102.

The common part 101 may be created using photolithography, but is preferably created using charged particle multi-beam lithography. The individualized area is typically created using charged particle multi-beam lithography.

Figure 2:
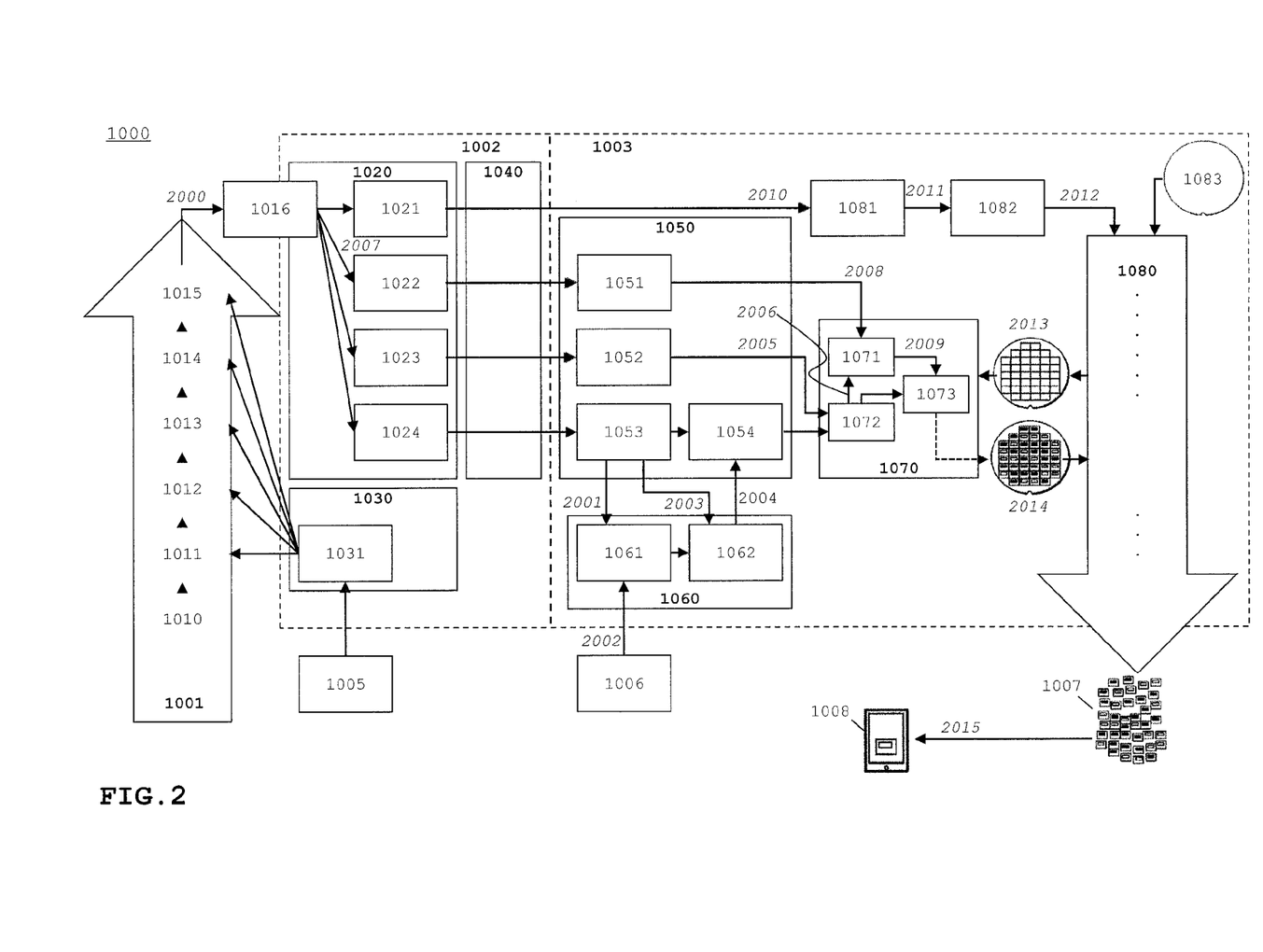
FIG. 2 shows a schematic diagram of systems involved in the manufacturing of electronic devices according to an exemplary embodiment of the invention.

FIG. 2 shows a semiconductor fabrication plant 1000, including systems and processes involved in the manufacturing of unique semiconductor chips, of an exemplary embodiment of the invention. In case reference numbers used in FIG. 2 refer to processes or operations, these reference numbers may also refer to computational units performing the processes or operations. Each of the shown processes and operations may be performed by a dedicated unit. Alternatively, one computational unit may perform multiple processes or operations shown in FIG. 2. A computational unit is for example a computer system including one or more processors and memory for running dedicated tasks or for running programs under an operating system.

The semiconductor fabrication plant 1000 may include a production setup part 1002 and a manufacturing part 1003. It is possible that no division is made into the two parts 1002 and 1003 or that another division is made. The manufacturing part 1003 may include one or more lithography subsystems 1070 each using a maskless pattern writer 1073. In this example the maskless lithographic exposure system is a charged particle multi-beamlet lithography system and the maskless pattern writer 1073 is a charged particle multi-beamlet lithography machine or e-beam machine.

At the left hand side of FIG. 2 a standard IC design flow 1001 is shown that typically results in the creation of mask order data, design layout data and/or wafer order data, jointly depicted as output 2000. The design layout data is typically generated in a GDSII or OASIS data format. The standard IC design flow is known in the art and typically includes a system/full IC design stage 1010, a circuit design VHL/Verilog stage 1011, a logical verification stage 1012, a placement & routing (P&R) stage 1013, a physical simulation stage 1014 and/or a design rule checks (DRC) stage 1015.

A process design kit 1030 including an add-ons and IP library may provide the building blocks in the form of reusable units of logic, cell or chip layout designs from a function IP blocks storage 1031 to various steps in the standard IC design flow 1001, as depicted by the arrows from the function IP blocks storage 1031 to steps 1011, 1012, 1013, 1014 and 1015 of the standard IC design flow 1001. The process design kit 1030 is typically located within the production setup part 1002 of the fab 1000, as it may concern function IP blocks licensed from an IP block designer 1005 to the chip manufacturer.

The created design layout data typically includes a common design layout part defining layout structures, possibly including via structures, applicable for all of the chips to be created. Furthermore the design layout data may include a non-common design layout part defining structures such as via structures applicable for certain ones of the electronic devices from which a different set of the structures is selectable to make the chips unique. Looking at the design layout data the distinction between the common design layout part and the non-common design layout part is preferably not apparent. To enable the selection of a set of structures from the non-common design layout part, location meta data may be generated along with the design layout data.

In the following examples the selectable structures are via structures and the location meta data is referred to as via location meta data.

The via location meta data may provide for each selectable via the location within the design layout. The via location meta data may be stored within the design layout data, but is preferably provided as a separate data file.

The output 2000 of the design flow 1001 may be provided to the charged particle multi-beamlet lithography system via a tape-out and sign-off process 1016. More specifically, the output 2000 may be input to a preparation part 1020 of the production setup 1002 where an optical proximity correction (OPC) operation 1021, a data preparation (PEC, fracturing) operation 1022, a recipe/process program (PP) generation operation 1023 and/or an order and production planning operation 1024 may be performed. The output of each of these operations may be transferred to the manufacturing part 1003 passing a verification step 1040.

In case a photolithography exposure is to be performed to a wafer prior to the maskless lithographic exposure, optical proximity correction (OPC) 1021 may be applied to the GDSII design layout data, resulting in corrected GDSII data 2010, which may be input to a mask shop 1081 together with the mask order data. This may result in a mask set 2011 that may be input to a reticle stocker 1082 from where reticles (masks) 2012 may be input to the CMOS wafer flow 1080. The wafer order data may be used to have wafers 1083 input to the CMOS wafer flow 1080 when needed. The photolithography exposure itself is not shown in FIG. 2. The resulting exposed wafer is shown as wafer 2013. Note that in case no photolithographic exposure is performed, the wafer 2013 may be an unexposed wafer.

The data preparation unit 1022 may pre-process the GDSII design layout data depicted as 2007 into pre-processed design layout data 2008. The pre-processed design layout data 2008 may include data specific to the lithography subsystem 1070. This off-line preprocessing of the GDSII data 2007 may include steps like flattening, proximity correction, resist heating correction and/or drawing of smart boundaries. The pattern vector data 2008 may be stored in a reticle storage 1051 of manufacturing execution system (MES) 1050.

The recipe/PP generation 1023 may generate instructions for the creation of process jobs (PJs). The PP and associated programs may be stored in a recipe/PP database 1052 of the MES 1050. A PP 2005 may be sent from the MES 1050 to a machine control 1072 of the lithography subsystem 1070 to instruct the machine control 1072 to create a PJ based on the PP. Additional commands may include Abort and Cancel instructions.

For example, via the order and production planning 1024, the manufacturing database 1053 of the MES 1050 may be provided with manufacturing specific information. From here a PJ input generator 1054 may be fed with information. The PJ input generator 1054 may provide PJ input to machine control 1072, where PJs 2006 may be generated for controlling parts of the lithography subsystem 1070, in particular rasterizer 1071 and pattern streamer (maskless pattern writer) 1073.

The operation of the lithography subsystem 1070 may be controlled using the PP, which may comprise a sequence of actions to be performed. The machine control 1072 may be loaded with a PP, and may schedule and execute the PP as may be requested by the recipe/PP generation 1023. The PP may take the role of a recipe, e.g. as defined in the SEMI E40 standard. Although the SEMI standards specify many requirements on how to deal with recipes, the standards may be contradictory so that recipes are preferably avoided. Instead, editable and unformatted PP may be used in the form of so-called Binary Large Objects (BLOBs).

The PP may be a pre-planned and reusable portion of the set of instructions, settings and/or parameters that may determine the processing environment of the wafer and that may be subject to change between runs or processing cycles. PPs may be designed by lithography tool designers or may be generated by tooling.

PPs may be uploaded to the lithography system by a user. PPs may be used to create PJs. A PJ may specify the processing to be applied to a wafer or set of wafers by the lithography subsystem 1070. A PJ may define which PP to use when processing a specified set of wafers and may include parameters from the PP (and optionally from the user). A PJ may be a system activity started by a user or host system.

PPs may be used not only for controlling the processing of wafers, but also for service actions, calibration functions, lithography element testing, modifying element settings, updating and/or upgrading software. Preferably no subsystem behavior occurs other than what is prescribed in a PP, with the exception of certain allowed additional categories, such as automatic initialization during power-up of a module or subsystem, periodic and unconditional behavior of a subsystem, as far as those don't influence PJ execution, and the response to an unexpected power-off, emergency or EMO activation.

A PP may be divided into steps. Most steps typically comprise a command and identify a subsystem which is to perform the command. The step may also include parameters to be used in performing the command, and parameter constraints. The PP may also include scheduling parameters to indicate when a step is to be performed, e.g. to be performed in parallel, in sequence, or synchronized.

To execute a command step of the PJ, the machine control 1072 may send the command indicated in the PJ to the subsystem indicated in the relevant step of the PJ. The machine control 1072 may monitor timing and may receive the results from the subsystem.

The pre-processed design layout data 2008 is typically stored in the reticle storage 1051 in a tool input data format, which is a vector format and includes dose information. The pre-processed design layout data 2008 may be provided from the reticle storage 1051 to the rasterizer 1071 of the lithography subsystem 1070, where it may be processed into beamlet control data such as pattern bitmap data 2009 for controlling the maskless pattern writer 1073 to expose a wafer for creation of the chip. The pre-processed design layout data 2008 may include all possible structures, in this example via structures, from which a selection is to be made for the creation of the unique chips. The selection may be made based on input from a secured, in-fab black box device 1060, which may generate selection data defining which of the via structures of the design layout data are applicable for each chip to be manufactured from the wafer, the selection data defining a different set of the via structures for different subsets of the chip.

The selection data, which is depicted as 2004 in FIG. 2, may be provided from the black box device 1060 to the PJ input generator 1054. Preferably, the selection data 2004 is encrypted. The PJ input generator 1054 may send the selection data 2004 to the machine control 1072, where a PJ 2006 may be generated instructing the rasterizer 1071 to generate the pattern bitmap data 2009 based on the selection data 2004.

Alternatively, the black box device 1060 may be configured to provide the selection data 2004 directly to the lithography subsystem 1070 for provisioning the selection data 2004 to the rasterizer 1071 without involving the PJ input generator 1054.

When the pre-processed design layout data 2008 does not include the via location meta data, and thus the locations of the selectable vias cannot be derived from the pre-processed design layout data 2008, the rasterizer may furthermore receive via location meta data 2003, typically together with the selection data but possibly as a separate file.

The via location meta data 2003 may be received together with the GDSII design layout data in the preparation part 1020. From there the via location meta data 2003 may be provided to the black box device 1060, e.g. via the recipe/PP generator 1023 or via the order and production planning 1024. The latter scenario is shown in FIG. 2, where the via location meta data 2003 follows the route from the order and production planning 1024 to the black box device 1060 via the manufacturing database 2003.

The black box 1060 may provide the via location meta data 2003 to the lithography subsystem 1070 following the same route as the selection data described above, e.g. via the PJ input generator 1054 or directly to the lithography subsystem 1070.

The black box device 1060 may be configured to provide only a subset of the via location meta data 2003 to the lithography subsystem 1070, e.g. only including the location information of the vias that are to be enabled in accordance with the provided selection data 2004.

The black box device 1060 may include an ID/key manager 1061 and a selection data generator 1062 that cooperate in the creation of the selection data 2004. The ID/key manager 1061 may receive product ID/serial number information 2001 from the manufacturing database 1053 and batches of ID/key pairs 2002 from a key management service 1006 possibly located outside of the maskless lithographic exposure system. The product ID/serial number information 2001 and the batches of ID/key pairs 2002 may be used to control the generation of the selection data 2004. Furthermore, the product ID/serial number information 2001 may be used to track the chips through the creation process to be able the chips to be matched with their ID/serial numbers after being created. Alternatively or additionally, the product ID/serial number information 2001 may be used to include the ID/serial number in or on the chip by a not shown but known per se process.

Exposure of the wafer 2013 according to the pattern bitmap data 2009 may result in exposing a pattern having a different subset of the via structures for different subsets of the chips. In FIG. 2 this is depicted as exposed wafer 2014. The exposed wafer 2014 may further be processed in accordance with the standard CMOS wafer flow 1080 typically including inspection, etching, deposition CMP and/or slicing steps. The resulting sliced chips 1007 may be unique chips that may be used e.g. in an end-user device 1008 for data security, traceability and/or anti-counterfeiting applications. Arrow 2015 depicts the provisioning of a unique chip to the end-user device 1008.

Process programs (PP) and process jobs (PJ) may be based on the SEMI standard, e.g. SEMI E30: "Generic Model for Communications and Control of Manufacturing Equipment (GEM)", SEMI E40: "Standard for Processing Management", SEMI E42: "Recipe Management Standard: Concepts, Behavior, and Message Services", and/or SEMI E139: "Specification for Recipe and Parameter Management (RaP)".

Figure 3:
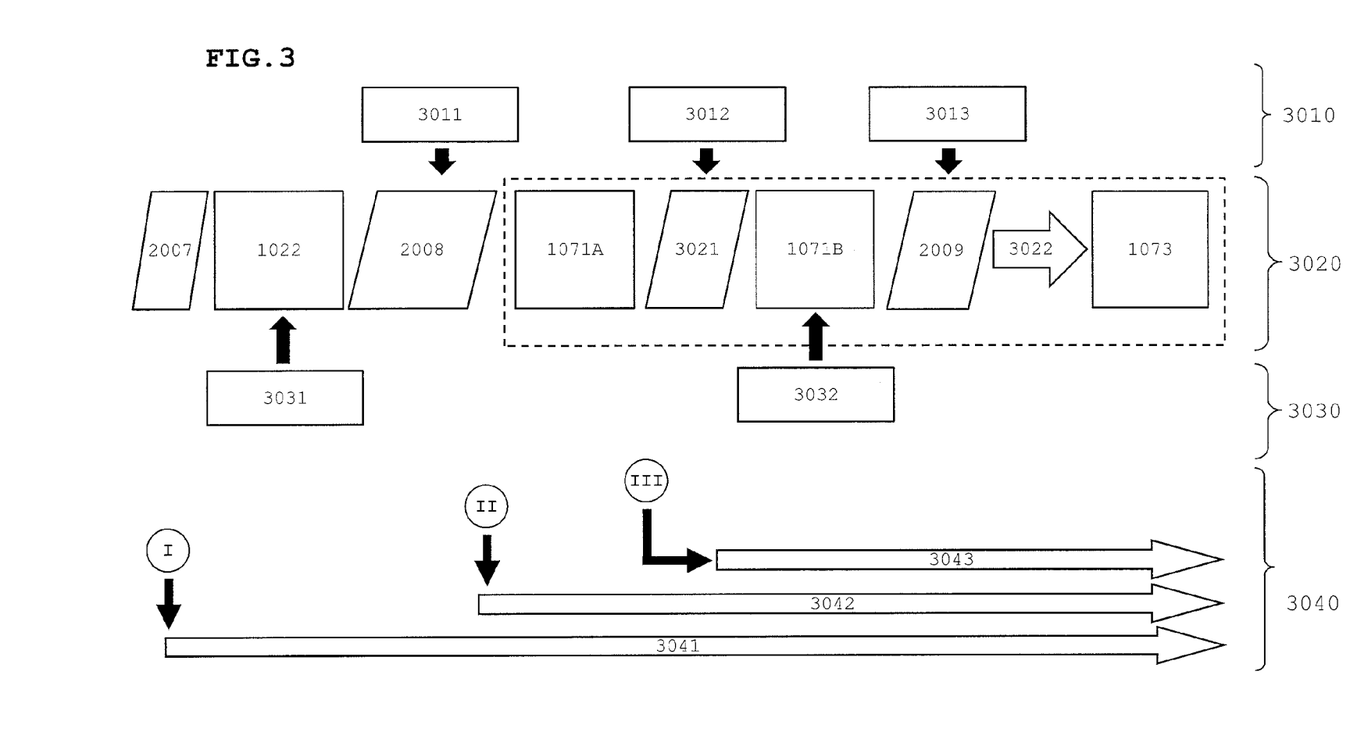
FIG. 3 shows a functional flow diagram of the creation of pattern bitmap data of an exemplary embodiment of the invention.

FIG. 3 shows an exemplary functional flow diagram of a data path using real-line rasterization, which may be followed in the generation of the pattern bitmap data 2009 from the GDSII design layout data 2007. The functional flow of FIG. 3 may be used in the maskless lithographic exposure system of FIG. 2. In FIG. 3 the functional flow diagram is split into four sections: 3010 is used to indicate a data format of underlying data outputs/inputs; 3020 shows the process flow including data outputs/inputs (parallelograms) and functional elements (rectangles); 3030 is used to indicate process steps performed at overlying functional elements; and 3040 is used to indicate how often the process steps are typically performed, e.g. once per design 3041, once per wafer 3042 or once per field 3043. Roman I, II and III indicate when via location meta data and/or selection data may be provided to the data path.

Input to the process may be the GDSII design layout data 2007, or a design layout in any other suitable format such as an OASIS data format. The GDSII design layout data 2007 may include the structures, e.g. via structures, from which a set of the via structures is to be selected to make the chips unique.

Data preparation unit 1022 may pre-processes the GDSII file 2007, typically as an off-line pre-processing operation. The pre-processing operation typically includes one or more of a flattening, a proximity correction, a resist heating correction and/or drawing of smart boundaries operation, jointly depicted as 3031. Output of the data preparation 1022 may be the pre-processed design layout data 2008 typically in a vector format including dose information, depicted as 3011. The format of the pre-processed design layout data 2008 is also known as a tool input data format. The data preparation 1022 is typically performed once per design depicted by arrow 3041, but may be performed once per wafer or once per field.

The pre-processing at the data preparation unit 1022 preferably does not expose a specific or unique chip design, i.e. the selection data 2004 is preferably not available at this stage in the data path, advantageously allowing the data preparation unit 1022 and the production setup part 1002 of the fab to be located in a less secure environment.

As described above, it is desirable to minimize exposure and exposure time of the specific or unique chip design part for security reasons. The security aspect is important as the uniqueness of the chip will typically be used for data security, traceability and/or anti-counterfeiting applications. The processes within the dashed block, i.e. from software processing 1071A until hardware processing at the pattern writer 1073, are typically performed within the lithography subsystem 1070 enabling a more secure operating environment. Furthermore, by providing the selection data 2004 only at the software processing 1071A or later, the amount of time that the unique features of the chips is used within the manufacturing part 1003 of the fab may be minimized.

The selection data 2004 is typically provided and used once per field. Roman III indicates the provisioning of the selection data 2004 to the data path at this stage. Alternatively but less preferred, the selection data 2004 may be provided and used once per wafer. Roman II indicates the provisioning of the selection data 2004 to the data path at this stage.

The location meta data 2003 may be provided to the lithography subsystem 1070 together with the selection data 2004, as described with FIG. 2. Alternatively, in case the selection data is embedded with the GDSII design layout data the location meta data may be provided once per design, as indicated with roman I.

The pre-processed GDSII design layout data 2008 may be input to a rasterizer 1071, which may includes a software processing part 1071A and a streaming part 1071B as shown in FIG. 3. Depending on whether the selection data 2004 is to be used once per wafer as depicted by roman II or once per field as depicted by roman III, the software processing part 1071A or the streaming part 1071B may use the selection data 2004 together with the via location meta data 2003 to enable the specific set of via structures as defined by the selection data 2004 in the pre-processed design layout data, thereby preparing the creation of the unique chip.

In-line processing of the pre-processed design layout data 2008 may be performed at the software processing part 1071A to rasterize the vector data to generate pattern system streaming (PSS) data 3021. The PSS data 3021 may be formatted as 4 bit greyscale bitmap data depicted as 3012.

The rasterizing may be performed in. The unique chip design part may be realized at this stage, as indicated by roman II The streaming part 1071B may then processes the PSS data 3021 to generate the pattern bitmap data 2009. Processes performed by the streaming part 1071B may include corrections involving a full or partial pixel shift in the X and/or Y direction for beam position calibration, field size adjustment and/or field position adjustment on the bitmap data. These processes are jointly depicted as 3032. Alternatively to entry point II, the unique design part may be realized at this stage, as indicated by roman III. The pattern bitmap data 2009 may be streamed to a pattern writer 1073 for exposure of the wafer. This streaming of the pattern bitmap data 2009 is depicted as 3022.

Rasterization may be performed at the streaming stage 1071B, which may involve real-time processing performed in hardware. Corrections for beam position calibration, field size adjustment, and/or field position adjustment (jointly depicted 3032) may be made on the vector format PSS format data 3021, and then rasterization may convert this to a pattern bitmap data. When the corrections are made on vector data, full pixel shifts, partial pixel shifts and/or subpixel shifts in the X and Y direction may be made.

The controlling of the maskless pattern writer 1073 typically involves a blanker being controlled by the pattern bitmap data. The pattern bitmap data 2009 may also be referred to as blanker format data.

Figure 4:
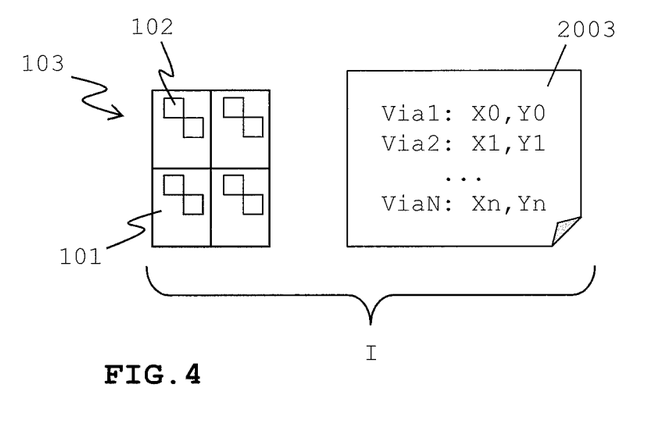
FIG. 4 represents a field defined by design layout data and via location meta data according to an exemplary embodiment of the invention.
Figure 5:
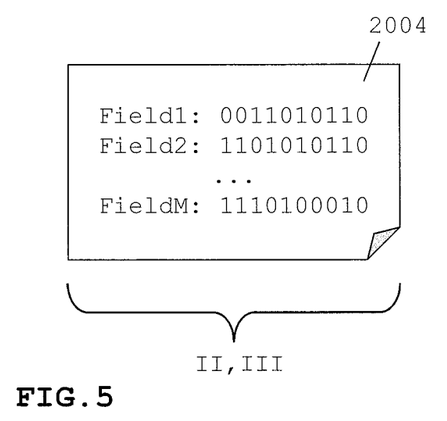
FIG. 5 represents selection data according to an exemplary embodiment of the invention.

FIG. 4 and FIG. 5 relate to an exemplary scenario wherein beamlet control data such as pattern bitmap data is generated once per field. FIG. 4 shows an exemplary embodiment of a field 103 defined by design layout data and location meta data 2003, e.g. via location meta data. In conjunction with FIG. 4, FIG. 5 represents selection data 2004. In this example the design layout data defines four unique chips within the field, each chip having a common part 101 that may be identical in all four chips and a to be individualized area 102 that may be different in each chip after selecting different sets of structures, e.g. vias, from the selectable structures defined in the design layout data.

The roman I, II and III indicate when, in this example, the respective data may be provided to the data path of FIG. 3.

The via location meta data 2003 may contain a list of the selectable vias and the coordinates of each selectable via within the design layout. In this example the vias are numbered from Via1 to ViaN, N being any positive index number. It will be understood that any other identification of the vias may be used instead or the identification of the vias may be left out completely using the position of the X,Y coordinates within a file (e.g. counting the line numbers) as identification of the vias. In this example the coordinates of each via is represented as an X,Y location. It will be understood that any other coordination system or indication of a location within the design layout may be used instead. Instead of via structures any other kind of structure may be identified with the location meta data, analogously to the example of FIG. 4.

The location meta data may include, in addition to the location of the structures, additional information about the structures, such as a width and/or a height of the structure. The location meta data may be optimized, e.g. by including meta data common to multiple structures only once.

The selection data 2004 may contain a list of fields and for each field n bits indicating for each of the Via1 . . . ViaN whether or not the via is to be enabled (bit value "1") or disabled (bit value "0"). Herein the bit location corresponds with the index of the via in the via location meta data 2003. Instead of a single bit, multiple bits may be used to indicate selected and/or non selected vias in the selection data. In this example the fields are numbered from Field1 to FieldM, M being any positive index number. It will be understood that any other identification of the fields may be used instead or the identification of the fields may be left out completely using the position of each set of field bits within a file (e.g. counting the line numbers) as identification of the fields.

The rasterizer 1071 may receive the selection data 2004 or a subset of the selection data relevant to the fields that are going to be exposed on the wafer. The selection data 2004 may be used to enable and disable the corresponding vias at the locations within the design layout as defined by the via location meta data 2003.

Figure 6:
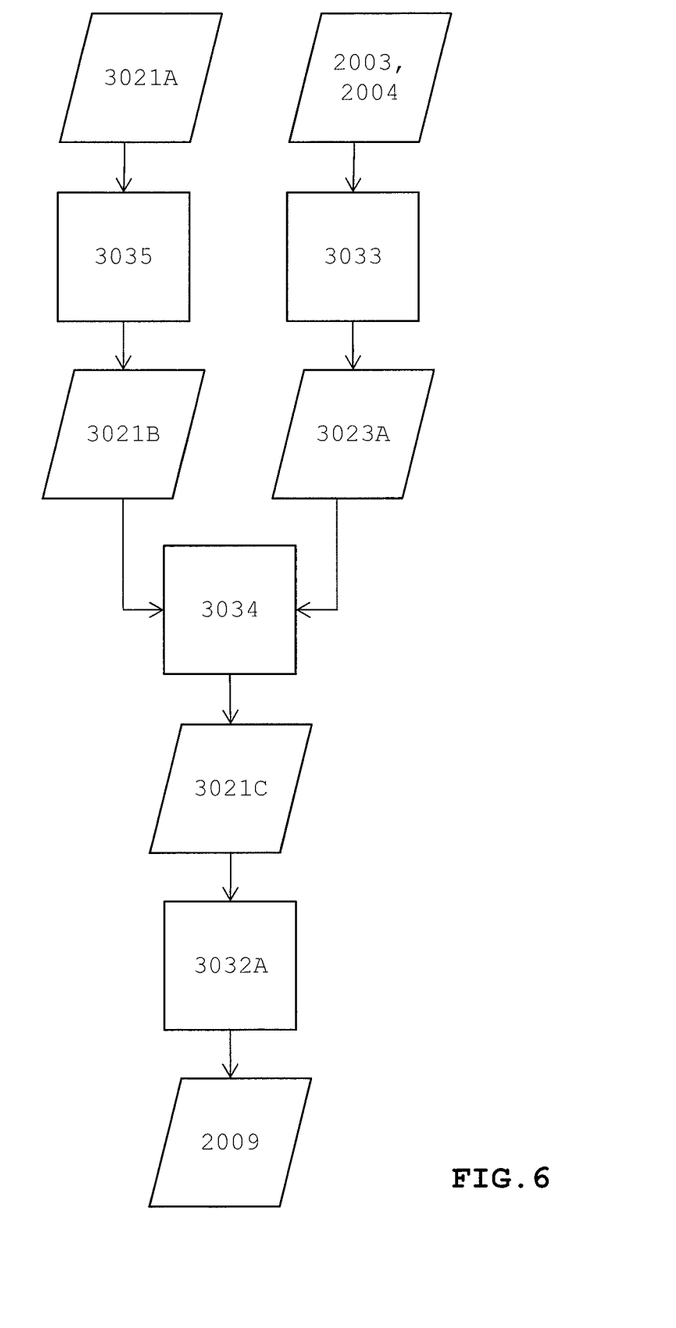
FIG. 6 shows a functional flow diagram of the creation of pattern bitmap data using a wipe out bitmap, according to an exemplary embodiment of the invention.

FIG. 6 represents a data flow in a part of a data path involved in the creation of pattern bitmap data 2009, according to an exemplary embodiment of the invention. Data is indicated as parallelograms and process steps are indicated as rectangular boxes.

At the start of the data flow on the left, pre-processed design layout data 2008 may have been processed into an intermediate 4 bits-per-pixel grey level bitmap 3021B, or any other suitable bitmap format, by a rasterizer 1071 e.g. as shown in FIG. 2 or any other processing unit, preferably part of a lithography subsystem 1070. This intermediate 4 bpp grey level bitmap 3021B may include all structures, e.g. vias from which a selection is to be made to create the unique chips. Optionally the intermediate 4 bpp grey level bitmap is in a compressed format 3021A and decompressed in a decompression step 3035. ZIP compression or any other suitable compression format may be used as a compression format.

On the top right location meta data 2003, e.g. via location meta data, and selection data 2004 may be input to a wipe out bitmap creation process 3033 for the creation of a wipe out bitmap 3023A. The wipe out bitmap is typically in a form allowing it to function as a mask for wiping out vias in the intermediate 4 bpp grey level bitmap. The wipe out bitmap 3023A may be intermediately stored in a compressed format and decompressed, possibly in real-time, before use in merger operation 3034.

In a merger operation 3034 the intermediate 4 bpp grey level bitmap and the wipe out bitmap may be merged, e.g. using an OR operation, resulting in the non-selected vias as defined in the selection data and as reflected in the wipe out bitmap to be deleted from the intermediate 4 bpp grey level bitmap. Hereto, for example, the bits defining vias in the intermediate 4 bpp grey level bitmap are given a binary zero value for non selected vias.

The resulting 4 bpp grey scale bitmap 3021C may be processed for pattern streamer corrections and a B/W dithering operation may be performed, as indicated as processing step 3032A. Processing step 3032A may be similar to operation 3032 of FIG. 3. This may results in the pattern bitmap data 2009 for controlling a maskless pattern writer, such as the maskless pattern writer 1073 of FIG. 3.

The processes 3033, 3034, 3035 and 3032A may be performed by a rasterizer 1071 or any other processing unit, preferably part of a lithography subsystem 1070. Processes 3032A, 3034 and/or 3035 may be performed in real-time. Typically, one or more of the process steps shown in FIG. 6 are performed in RAM memory and the wipe out bitmap 3023A, the intermediate 4 bpp grey level bitmap 3021B and/or the 4 bpp grey scale bitmap 3021C, or parts thereof, are stored in RAM memory only during processing of the data into the pattern bitmap data 2009. For increased processing performance, preferably the merger operation 3034 and possibly also the decompression operation 3035 are implemented in hardware, e.g. in FPGA or ASIC.

In an exemplary embodiment the intermediate 4 bpp grey scale bitmap 3021B may define a stripe of a field of a wafer, e.g. covering an area of 2 μm by 33 mm of the wafer. Each 4 bits pixel of the intermedia 4 bpp grey scale bitmap 3021B may cover an area of 5.4 nm by 5.4 nm. The wipe out bitmap 3023A may be a 1 bpp bitmap covering one stripe or scan line on the wafer, e.g. covering an area of 2 μm by 300 mm. Each 1 bit pixel of the wipe out bitmap 3023A may cover an area of 43.2 nm by 43.2 nm in this example. Thus, the wipe out bitmap may have a lower resolution than the intermediate 4 bpp grey scale bitmap, resulting in the merger operation 3034 to wipe out larger areas at ones in the intermediate 4 bpp grey scale bitmap.

In another exemplary embodiment the intermediate multi-level grey scale bitmap such as a 4 bpp grey scale bitmap 3021B may define a stripe of a field of a wafer, e.g. covering an area of 2 μm by 33 mm of the wafer. Each 4 bits pixel of the intermedia 4 bpp grey scale bitmap 3021B may cover an area of 5.4 nm by 5.4 nm. The wipe out bitmap 3023A may be a 4 bpp sparse bitmap covering one stripe on the wafer, e.g. covering an area of 2 μm by 300 mm. Each 4 bits pixel of the wipe out bitmap 3023A may cover an area of 5.4 nm by 5.4 nm in this example. Thus, the wipe out bitmap may have the same resolution as the intermediate 4 bpp grey scale bitmap, causing the merger operation 3034 to wipe out pixels at exact locations defined by the wipe out bitmap 3023A.

Optionally the wipe out bitmap data 3023A, especially when in a sparse bitmap format, may be stored in a compressed format in RAM and decompressed on the fly when performing the merger operation 3034.

In the examples of FIG. 6 the wipe out bitmap 3023A indicating the vias to be deleted is merged with an intermediate bitmap 3021B resulting in a bitmap 3021C wherein the vias are deleted. Instead of operating on data in a bitmap format, a similar wipe out operation may be performed on vector format data files. Instead of an intermediate 4 bpp grey level bitmap 3021B a vector based data file including all selectable structures, e.g. vias, may then be merged with a vector based wipe out data file defining the structures to be deleted or disabled. In this alternative example the result of the merging operation will typically be in a vector based data format that may be converted in one or more steps into the pattern bitmap data 2009 for controlling the maskless pattern writer.

The wipe out bitmap and the wipe out vector data may jointly be referred to as wipe out mask data.

Figure 7:
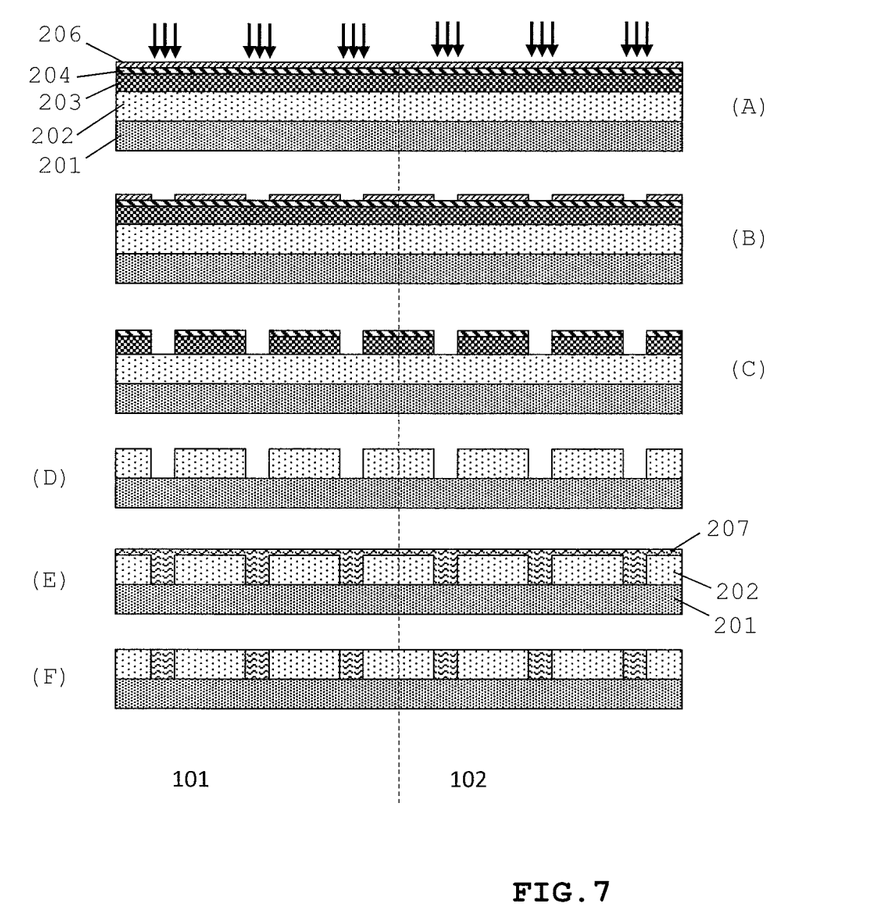
FIG. 7 shows a process of creating vias according to an exemplary embodiment of the invention.

FIG. 7 shows a process of creating a unique chip according to an exemplary embodiment of the invention. A cross sectional side view of a wafer is shown at six stages (A)-(F) of creating the unique chip. At each stage the wafer is shown comprising a number of layer 201-206. Between the stages (A)-(F) same patterns indicate same layers. In this example a common part 101 of the chip and an individualized area 102 of the chip are created using charged particle multi-beamlet lithography.

At the beginning of the process (A) the wafer may comprise five layers: a bottom metal layer 201, an isolation layer 202 (for example SiO$_2$), under layers 203 and 204 (e.g. SOC+SiARC HM) and a top e-beam resist layer 206 (e.g. KrF resist).

The top layer 206 may be exposed using an e-beam exposure under control of pattern bitmap data 2009, depicted by the top arrows, followed by a development step wherein structures defined by the e-beams are removed from the resist layer 206. The result of the development step is shown as stage (B). In an etching and stripping step these structures may be etched into the SOC under layer 204 and the SiARC under layer 203, and the resist may be removed. The result is shown as stage (C). Subsequently the structures may be etched into the isolation layer 202, and the under layers 203, 204 may be stripped, the result of which is shown as stage (D).

Next, a conductive layer 207 may be applied onto the etched and stripped isolation layer for both the identical part and the unique part of the chip, the result of which is shown as stage (E). For example a chemical vapor deposition with Tungsten (CVD-W) may be used. Chemical-mechanical planarization (CMP) may remove superfluous conductive material resulting in stage (F) wherein the wafer may have a bottom metal layer 201 and on top of that a layer comprising isolation material and conductive material. Vias may be created by this conductive material.

In the example of FIG. 7 vias may be created in a single layer, i.e. the second layer from the bottom. The process may be altered to create conductive material at a different layer for the creation of vias at the different layer and/or multiple layers with conductive material may be created for vias at multiple layers. The process may be altered to create connections between a metal layer and a gate e.g. in a contact layer, to create connections in a local interconnect layer. The process may also or additionally alter the formation or structure of diffusion regions (e.g. P- or N-doped regions) or enable or disable P or N implants of certain parts of a transistor or diode.

Figure 8:
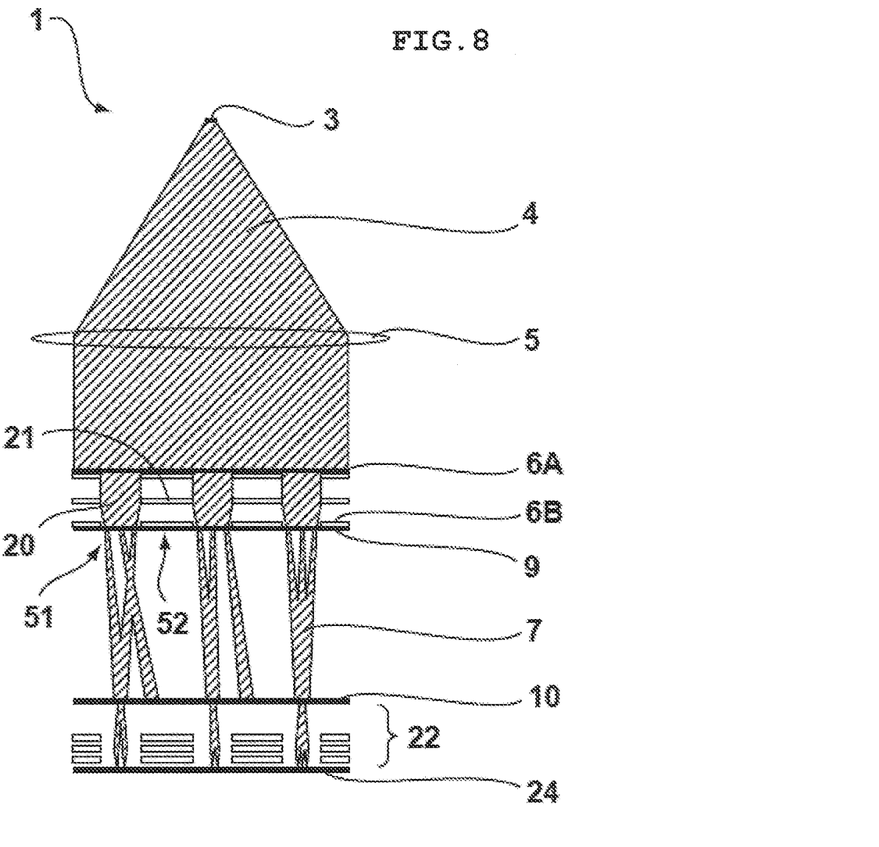
FIG. 8 shows a simplified schematic drawing of an exemplary embodiment of a charged particle multi-beamlet lithography system.

FIG. 8 shows a simplified schematic drawing of an exemplary embodiment of a charged particle multi-beamlet lithography machine 1, which may be used for implementing the maskless pattern writer 1073. Such a lithography machine suitably comprises a beamlet generator generating a plurality of beamlets, a beamlet modulator patterning said beamlets into modulated beamlets, and a beamlet projector for projecting said beamlets onto a surface of a target. The target is for example a wafer. The beamlet generator typically comprises a source and at least one aperture array. The beamlet modulator is typically a beamlet blanker with a blanking deflector array and a beam stop array. The beamlet projector typically comprises a scanning deflector and a projection lens system.

The lithography machine 1 may comprise an electron source 3 for producing a homogeneous, expanding electron beam 4. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 4 from the electron source 3 may pass a double octopole and subsequently a collimator lens 5 for collimating the electron beam 4. As will be understood, the collimator lens 5 may be any type of collimating optical system. Subsequently, the electron beam 4 may impinge on a beam splitter, which is in one suitable embodiment an aperture array 6A. The aperture array 6A may block part of the beam and may allow a plurality of subbeams 20 to pass through the aperture array 6A. The aperture array preferably comprises a plate having through-holes. Thus, a plurality of parallel electron subbeams 20 may be produced.

A second aperture array 6B may create a number of beamlets 7 from each subbeam. Beamlets are also being referred to as e-beams. The system may generate a large number of beamlets 7, preferably about 10,000 to 1,000,000 beamlets, although it is of course possible to use more or less beamlets. Note that other known methods may also be used to generate collimated beamlets. This allows the manipulation of the subbeams, which turns out to be beneficial for the system operation, particularly when increasing the number of beamlets to 5,000 or more. Such manipulation is for instance carried out by a condenser lens, a collimator, or lens structure converging the subbeams to an optical axis, for instance in the plane of the projection lens.

A condenser lens array 21 (or a set of condenser lens arrays) may be included behind the subbeam creating aperture array 6A, for focusing the subbeams 20 towards a corresponding opening in the beam stop array 10. A second aperture array 6B may generate beamlets 7 from the subbeams 20. Beamlet creating aperture array 6B is preferably included in combination with the beamlet blanker array 9. For instance, both may be assembled together so as to form a subassembly. In FIG. 8, the aperture array 6B produces three beamlets 7 from each subbeam 20, which strike the beam stop array 10 at a corresponding opening so that the three beamlets are projected onto the target by the projection lens system in the end module 22. In practice a much larger number of beamlets may be produced by aperture array 6B for each projection lens system in end module 22. In one embodiment, 49 beamlets (arranged in a 7×7 array) may be generated from each subbeam and are directed through a single projection lens system, although the number of beamlets per subbeam may be increased to 200 or more.

Generating the beamlets 7 stepwise from the beam 4 through an intermediate stage of subbeams 20 has the advantage that major optical operations may be carried out with a relatively limited number of subbeams 20 and at a position relatively remote from the target. One such operation is the convergence of the subbeams to a point corresponding to one of the projection lens systems. Preferably the distance between the operation and the convergence point is larger than the distance between the convergence point and the target. Most suitably, use is made of electrostatic projection lenses in combination herewith. This convergence operation enables the system to meet requirements of reduced spot size, increased current and reduced point spread, so as to do reliable charged particle beam lithography at advanced nodes, particularly at nodes with a critical dimension of less than 90 nm.

The beamlets 7 may next pass through an array of modulators 9. This array of modulators 9 may comprise a beamlet blanker array having a plurality of blankers, which are each capable of deflecting one or more of the electron beamlets 7. The blankers may more specifically be electrostatic deflectors provided with a first and a second electrode, the second electrode being a ground or common electrode. The beamlet blanker array 9 constitutes with beam stop array 10 a modulating device. On the basis of beamlet control data, the modulating means 8 may add a pattern to the electron beamlets 7. The pattern may be projected onto the target 24 by means of components present within an end module 22.

In this embodiment, the beam stop array 10 comprises an array of apertures for allowing beamlets to pass through. The beam stop array, in its basic form, may comprise a substrate provided with through-holes, typically round holes although other shapes may also be used. In one embodiment, the substrate of the beam stop array 8 may be formed from a silicon wafer with a regularly spaced array of through-holes, and may be coated with a surface layer of a metal to prevent surface charging. In one embodiment, the metal may be of a type that does not form a native-oxide skin, such as CrMo.

In one embodiment, the passages of the beam stop array 10 may be aligned with the holes in the beamlet blanker array 9. The beamlet blanker array 9 and the beamlet stop array 10 typically operate together to block or let pass the beamlets 7. If beamlet blanker array 9 deflects a beamlet, it will not pass through the corresponding aperture in beamlet stop array 10, but instead will be blocked by the substrate of beamlet block array 10. But if beamlet blanker array 9 does not deflect a beamlet, then it will pass through the corresponding apertures in beamlet stop array 10 and will then be projected as a spot on a target surface 13 of the target 24.

The lithography machine 1 may furthermore comprise a data path for supplying beamlet control data, e.g. in the form of pattern bitmap data 2009, to the beamlet blanker array 9. The beamlet control data may be transmitted using optical fibers. Modulated light beams from each optical fiber end may be projected on a light sensitive element on the beamlet blanker array 9. Each light beam may hold a part of the pattern data for controlling one or more modulators coupled to the light sensitive element.

Subsequently, the electron beamlets 7 may enter the end module. Hereinafter, the term 'beamlet' refers to a modulated beamlet. Such a modulated beamlet effectively comprises time-wise sequential portions. Some of these sequential portions may have a lower intensity and preferably have zero intensity—i.e. portions stopped at the beam stop. Some portions may have zero intensity in order to allow positioning of the beamlet to a starting position for a subsequent scanning period.

The end module 22 is preferably constructed as an insertable, replaceable unit, which comprises various components. In this embodiment, the end module may comprise a beam stop array 10, a scanning deflector array 11, and a projection lens arrangement 12, although not all of these need be included in the end module and they may be arranged differently.

After passing the beamlet stop array 10, the modulated beamlets 7 may pass through a scanning deflector array 11 that provides for deflection of each beamlet 7 in the X- and/or Y-direction, substantially perpendicular to the direction of the undeflected beamlets 7. In this embodiment, the deflector array 11 may be a scanning electrostatic deflector enabling the application of relatively small driving voltages.

Next, the beamlets may pass through projection lens arrangement 12 and may be projected onto a target surface 24 of a target, typically a wafer, in a target plane. For lithography applications, the target usually comprises a wafer provided with a charged-particle sensitive layer or resist layer. The projection lens arrangement 12 may focus the beamlet, for example resulting in a geometric spot size of about 10 to 30 nanometers in diameter. The projection lens arrangement 12 in such a design for example provides a demagnification of about 100 to 500 times. In this preferred embodiment, the projection lens arrangement 12 is advantageously located close to the target surface.

In some embodiments, a beam protector may be located between the target surface 24 and the focusing projection lens arrangement 12. The beam protector may be a foil or a plate, provided with needed apertures, for absorbing the resist particles released from the wafer before they can reach any of the sensitive elements in the lithography machine. Alternatively or additionally, the scanning deflection array 9 may be provided between the projection lens arrangement 12 and the target surface 24.

Roughly speaking, the projection lens arrangement 12 focuses the beamlets 7 to the target surface 24. Therewith, it further ensures that the spot size of a single pixel is correct. The scanning deflector 11 may deflect the beamlets 7 over the target surface 24. Therewith, it needs to ensure that the position of a pixel on the target surface 24 is correct on a microscale. Particularly, the operation of the scanning deflector 11 needs to ensure that a pixel fits well into a grid of pixels which ultimately constitutes the pattern on the target surface 24. It will be understood that the macroscale positioning of the pixel on the target surface is suitably enabled by a wafer positioning system present below the target 24.

Such high-quality projection may be relevant to obtain a lithography machine that provides a reproducible result. Commonly, the target surface 24 comprises a resist film on top of a substrate. Portions of the resist film may be chemically modified by application of the beamlets of charged particles, i.e. electrons. As a result thereof, the irradiated portion of the film may be more or less soluble in a developer, resulting in a resist pattern on a wafer. The resist pattern on the wafer may subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. Moreover, many of such lithography machines make use of a plurality of beamlets. No difference in irradiation ought to result from deflection steps.

Figure 9:
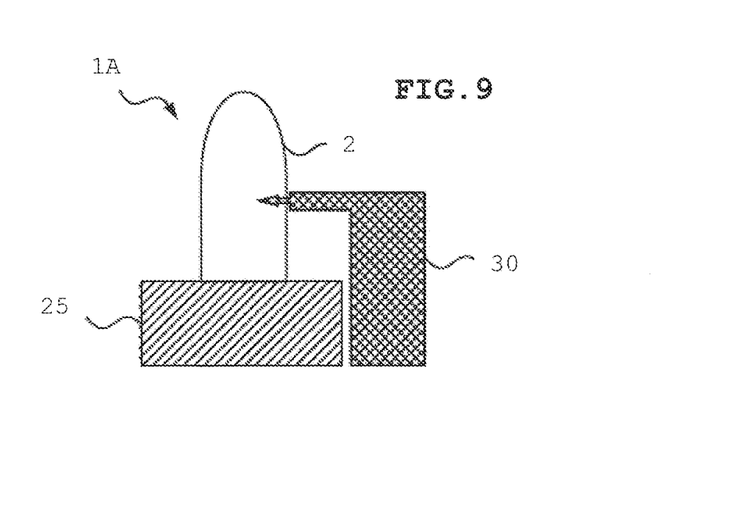
FIG. 9 is a conceptual diagram showing an exemplary maskless lithography system.

FIG. 9 shows a conceptual diagram of an exemplary charged particle lithography system 1A, divided into three high level sub-systems: a wafer positioning system 25, an electron optical column 20, and data path 30. The wafer positioning system 25 moves the wafer 24 under the electron optical column 20 in the x-direction. The wafer position system 25 may be provided with synchronization signals from the data path sub-system 30 to align the wafer with the electron beamlets generated by the electron-optical column 20. The electron-optical column 20 may include the charged particle multi-beamlet lithography machine 1 as shown in FIG. 8. Switching of the beamlet blanker array 9 may also be controlled via the data path sub-system 30, using pattern bitmap data 2009. The data path sub-system 30 may be implemented in accordance with FIG. 3.

As shown in the above examples, a maskless pattern writer may apply a raster scan to the wafer under control of pattern bitmap data. Alternatively, a maskless pattern writer may apply a vector scan to the wafer. A vector scan typically differs from a raster scan in that it does no sequentially go through every location of the wafer; instead, it finishes exposing one local area and flies to the next. With vector scanning a beam settling time is typically needed before the subsequent exposure resumes. This settling time is typically not needed for the raster scan. The pattern bitmap data and the control data for vector scanning may generally be referred to as beamlet control data.

The invention claimed is:

1. A computer-implemented method for generating beamlet control data for controlling a maskless pattern writer to expose a wafer for creation of electronic devices using a maskless lithographic exposure system using a maskless pattern writer such that exposure of the wafer according to the beamlet control data results in exposing a pattern having a different set of structures for different subsets of the electronic devices, the method comprising:
   receiving design layout data defining a plurality of structures for the electronic devices to be manufactured from the wafer;
   receiving selection data defining which of the structures of the design layout data are applicable for each electronic device to be manufactured from the wafer, the selection data defining a different set of the structures for different subsets of the electronic devices; and
   generating the beamlet control data based on the received design layout data and the received selection data.

2. The method according to claim 1, wherein the step of generating the beamlet control data is additionally based on location meta data, wherein the location meta data specifies locations of the structures defined in the design layout data.

3. The method according to claim 1, further comprising generating wipe out mask data based on the location meta data and the selection data, and wherein the generating of the beamlet control data comprises merging the wipe out mask data with the design layout data or a derivative of the design layout data to delete non selected structures from the design layout data.

4. A data processing system comprising a processor configured to perform a computer-implemented method for generating beamlet control data for controlling a maskless pattern writer to expose a wafer for creation of electronic devices using a maskless lithographic exposure system using a maskless pattern writer such that exposure of the wafer according to the beamlet control data results in exposing a pattern having a different set of structures for different subsets of the electronic devices, the method comprising:
   receiving design layout data defining a plurality of structures for the electronic devices to be manufactured from the wafer;
   receiving selection data defining which of the structures of the design layout data are applicable for each electronic device to be manufactured from the wafer, the selection data defining a different set of the structures for different subsets of the electronic devices; and
   generating the beamlet control data based on the received design layout data and the received selection data.

5. A computer-implemented method for generating selection data, the selection data defining structures of design layout data applicable for an electronic device to be manufactured from a wafer, the method comprising:
   generating the selection data by defining which of the structures of the design layout data are applicable for each electronic device to be manufactured from the wafer, such that the selection data defines a different set of the structures for different subsets of electronic devices.

6. The method according to claim 5, wherein the generating of the selection data further comprises defining a location of each of the structures within a design layout of the electronic device defined by the design layout data.

7. A data processing system comprising a processor configured to perform a computer-implemented method for generating selection data, the selection data defining structures of design layout data applicable for an electronic device to be manufactured from a wafer, the method comprising:
   generating the selection data by defining which of the structures of the design layout data are applicable for each electronic device to be manufactured from the wafer, such that the selection data defines a different set of the structures for different subsets of electronic devices.

8. A computer program product, implemented on computer-readable non-transitory storage medium, comprising instructions which, when the computer program product is executed by a computer, cause the computer to carry out a computer-implemented method for generating selection data, the selection data defining structures of design layout data applicable for an electronic device to be manufactured from a wafer, the method comprising:
generating the selection data by defining which of the structures of the design layout data are applicable for each electronic device to be manufactured from the wafer, such that the selection data defines a different set of the structures for different subsets of electronic devices.

9. A computer-readable non-transitory storage medium comprising instructions which, when executed by a computer, cause the computer to carry out a computer-implemented method for generating selection data, the selection data defining structures of design layout data applicable for an electronic device to be manufactured from a wafer, the method comprising:
generating the selection data by defining which of the structures of the design layout data are applicable for each electronic device to be manufactured from the wafer, such that the selection data defines a different set of the structures for different subsets of electronic devices.

10. The method according to claim 1, wherein the design layout data comprises:
common design layout data defining structures applicable for all of the electronic devices; and
non-common design layout data defining structures applicable for certain ones of the electronic devices from which the different set of the structures is selectable according to the selection data.

11. The method according to claim 1, wherein the selection data specifies for each of the electronic devices whether the beamlet control data includes or does not include data defining one or more of the structures defined in the design layout data.

12. The method according to claim 1, wherein the design layout data only includes design layout data defining the structures selectable according to the selection data.

13. The method according to claim 1, wherein the step of generating the beamlet control data is additionally based on location meta data, wherein the location meta data specifies locations of the structures defined in the design layout data.

14. The method according to claim 13, further comprising generating wipe out mask data based on the location meta data and the selection data, and wherein the generating of the beamlet control data comprises merging the wipe out mask data with the design layout data or a derivative of the design layout data to delete non selected structures from the design layout data.

15. The method according to claim 1, wherein the electronic devices are semiconductor chips, and wherein the maskless pattern writer is a charged particle multi-beamlet lithography machine.

16. The method according to claim 1, wherein the structures include at least one of:
connections between metal layers, also known as vias;
connections between a metal layer and a gate in a contact layer;
connections in a local interconnect layer; and
P or N implants of certain parts of a transistor or diode.

17. Method of manufacturing electronic devices using a maskless lithographic exposure system comprising a maskless pattern writer, the method comprising:
controlling the maskless pattern writer using beamlet control data generated according to claim 1, to expose a wafer for creation of the electronic devices
wherein exposure of the wafer according to the beamlet control data results in exposing a pattern having a different set of the structures for different subsets of the electronic devices.

18. The method according to claim 17, further comprising:
receiving the design layout data in the maskless lithographic exposure system via a first network path; and
receiving the selection data in the maskless lithographic exposure system via a second network path separate from the first network path.

19. A maskless lithographic exposure system configured to perform a method of manufacturing electronic devices using a maskless lithographic exposure system using a maskless pattern writer, the method comprising:
controlling the maskless pattern writer using beamlet control data generated according to claim 1, to expose a wafer for creation of the electronic devices
wherein exposure of the wafer according to the beamlet control data results in exposing a pattern having a different set of the structures for different subsets of the electronic devices.

20. The maskless lithographic exposure system according to claim 19, comprising a black box device configured to generate the selection data defining which of the structures of the design layout data are applicable for each electronic device to be manufactured from the wafer, the selection data defining a different set of the structures for different subsets of the electronic devices.

21. A semiconductor fabrication plant comprising a maskless lithography exposure system according to claim 19.

* * * * *